(12) United States Patent
Kim

(10) Patent No.: US 10,096,636 B2
(45) Date of Patent: Oct. 9, 2018

(54) LIGHT FIELD IMAGING DEVICE AND METHOD FOR FABRICATING THE SAME

(71) Applicant: SK hynix Inc., Gyeonggi-do (KR)

(72) Inventor: Jong Eun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 16 days.

(21) Appl. No.: 15/084,195

(22) Filed: Mar. 29, 2016

(65) Prior Publication Data

US 2017/0179180 A1 Jun. 22, 2017

(30) Foreign Application Priority Data

Dec. 21, 2015 (KR) .......................... 10-2015-0182668

(51) Int. Cl.
*H01L 27/146* (2006.01)

(52) U.S. Cl.
CPC .. *H01L 27/14627* (2013.01); *H01L 27/14645* (2013.01); *H01L 27/14685* (2013.01)

(58) Field of Classification Search
CPC ......... H01L 27/14627; H01L 27/14625; H01L 27/14685

See application file for complete search history.

(56) References Cited

U.S. PATENT DOCUMENTS

| | | | |
|---|---|---|---|
| 2008/0291303 A1* | 11/2008 | Onozawa ............. | G02B 5/1885 348/294 |
| 2011/0018080 A1* | 1/2011 | Ootake ............. | H01L 27/14621 257/432 |
| 2013/0033636 A1 | 2/2013 | Pitts et al. | |
| 2013/0075587 A1* | 3/2013 | Suzuki ............. | H01L 27/14618 250/208.1 |
| 2014/0103476 A1* | 4/2014 | Jin ....................... | H01L 31/0203 257/432 |
| 2014/0183334 A1 | 7/2014 | Wang et al. | |
| 2014/0299587 A1 | 10/2014 | Rudmann et al. | |

* cited by examiner

*Primary Examiner* — Shaun Campbell
*Assistant Examiner* — Aneta Cieslewicz
(74) *Attorney, Agent, or Firm* — IP & T Group LLP

(57) ABSTRACT

A light field imaging device includes an image sensor having a plurality of pixels arranged two-dimensionally therein; a microlens array formed over the image sensor, the microlens array having a plurality of microlenses arranged two-dimensionally therein; and a plurality of support structures formed between the image sensor and the microlens array for providing an air gap therebetween.

18 Claims, 12 Drawing Sheets

LIGHT FIELD IMAGING DEVICE AND METHOD FOR FABRICATING THE SAME

CROSS-REFERENCE TO RELATED APPLICATION

The present application claims priority of Korean Patent Application No. 10-2015-0182668, filed on Dec. 21, 2015, which is incorporated herein by reference in its entirety.

BACKGROUND

Exemplary embodiments of the present invention relate generally to a semiconductor device fabrication technology, and more particularly, to a light field imaging device including an image sensor and a method for fabricating the same.

Image sensors may convert optical images into electrical signals. With the development of the computer and communication industries, there has been increased demand for image sensors having improved performance in various applications, such as digital cameras, camcorders, smart phones, game machines, security cameras, medical micro cameras, robots and the like.

SUMMARY

Various embodiments of the present invention are directed to a light field imaging device with improved performance and a method for fabricating the same.

In an embodiment, a light field imaging device may include: an image sensor having a plurality of pixels arranged two-dimensionally therein; a microlens array formed over the image sensor, the microlens array having a plurality of microlenses arranged two-dimensionally therein; and a plurality of support structures formed between the image sensor and the microlens array for providing an air gap therebetween.

Each of the plurality of microlens may correspond to a plurality of pixels. Each of the plurality of microlenses may have a plurality of vertices, and at least two vertices of the plurality of vertices may overlap with the support structures. Each of the plurality of microlenses may have a plurality of vertices, and two of the vertices positioned in a diagonal direction may overlap with the support structures. When viewed from the top, each of the plurality of microlenses may have a polygonal shape which has at least four sides and is rounded at respective vertices. Each of the plurality of microlenses may include a hemispherical lens or a digital lens. The plurality of support structures may be disposed in a zigzag pattern to overlap with vertices of the plurality of microlenses. A plurality of microlenses may share each of the plurality of support structures. Each of the plurality of support structures may have a pillar shape.

In an embodiment, a light field imaging device may include: an image sensor including a sub-microlens array in which a plurality of sub-microlenses are arranged two-dimensionally; a microlens array formed over the image sensor, and having a plurality of microlenses arranged two-dimensionally therein; and a support structure formed between the image sensor and the microlens array for providing an air gap therebetween, the support structure including: a plurality of first support structures formed over the image sensor to support the microlens array, and having a pillar shape; and a second support structure coupled to the first support structures to contact a bottom surface of the microlens array, and having a plate shape.

Each of the plurality of microlens may correspond to a plurality of sub-microlenses. The sub-microlenses may be not formed in regions corresponding to respective vertices of the plurality of microlenses. The sub-microlenses formed in regions corresponding to respective vertices of the plurality of microlenses have a shape different from sub-microlenses formed in the other regions. Each of the plurality of sub-microlenses may include a hemispherical lens or a digital lens. When viewed from the top, each of the plurality of sub-microlenses may have a polygonal shape which has at least four sides and is rounded at respective vertices, or a circular shape. Each of the plurality of microlenses may have a plurality of vertices, and at least two vertices of the plurality of vertices overlap with the first support structures. Each of the plurality of microlenses may have a plurality of vertices, and two of the vertices positioned in a diagonal direction overlap with the first support structures. When viewed from the top, each of the plurality of microlenses may have a polygonal shape which has at least four sides and is rounded at respective vertices. Each of the plurality of microlenses may include a hemispherical lens or a digital lens. The plurality of first support structures may be disposed in a zigzag pattern to overlap with vertices of the plurality of microlenses. A plurality of microlenses may share each of the plurality of first support structures. Each of the plurality of first support structures may include a first support layer having a cylinder shape or a hollow pillar shape. Each of the plurality of first support structures may further include a sealing layer formed over the first support layer to fill inside spaces formed by the first support layer. The sealing layer may include the same material as the plurality of microlenses or the first support layer. The second support structure may include a second support layer extended from the first support layer, and contacting bottom surfaces of the plurality of microlenses; and a plurality of openings formed in the second support layer between the plurality of microlenses. The second support layer may be integrated with the first support layer. The plurality of openings may be disposed in a zigzag pattern to deviate from the plurality of first support structures. The plurality of first support structures and the plurality of openings may be disposed alternately with each other.

In an embodiment, a method for fabricating a light field imaging device may include: preparing an image sensor in which a plurality of pixels are arranged two-dimensionally; forming a sacrificial layer over the image sensor; forming a plurality of first openings by selectively etching the sacrificial layer; forming a support layer over a structure including the plurality of first openings; forming a microlens array in which a plurality of microlenses are arranged two-dimensionally, over the support layer; forming a plurality of second openings by etching the support layer and portions of the sacrificial layer between the plurality of microlenses; and forming an air gap by removing the sacrificial layer through the second openings. Furthermore, the method may further include forming a first protective layer over the image sensor, before the forming of the sacrificial layer; and forming a second protective layer over the microlens array, before the forming of the plurality of second openings.

The first protective layer, the second protective layer and the support layer may be made of a material having an etching selectivity with respect to the sacrificial layer. The support layer may be formed over a surface of the structure including the plurality of first openings, to have a uniform thickness. The support layer may be formed not to completely fill the plurality of first openings. Each of the plurality of microlenses may have a plurality of vertices and is formed such that at least two vertices of the plurality of vertices overlap with the support layer formed in the first openings. Each of the plurality of microlenses may have a plurality of vertices, and is formed such that two of the vertices positioned in a diagonal direction overlap with the support layer formed in the first openings.

According to the above embodiments, since the light field imaging device includes a support structure which is formed between an image sensor and a microlens array and provides an air gap therebetween, the image sensor and the microlens array may be integrated in a chip, and at the same time, optical loss according to the integration may be substantially prevented.

BRIEF DESCRIPTION OF THE DRAWINGS

FIGS. 7, 8B, 9B, 10B, 11B, 12B and 13B are cross-sectional views corresponding to the line B-B' of FIG. 2, illustrating a method for fabricating the light field imaging device, according to an embodiment of the present invention.

DETAILED DESCRIPTION

Figure 1:
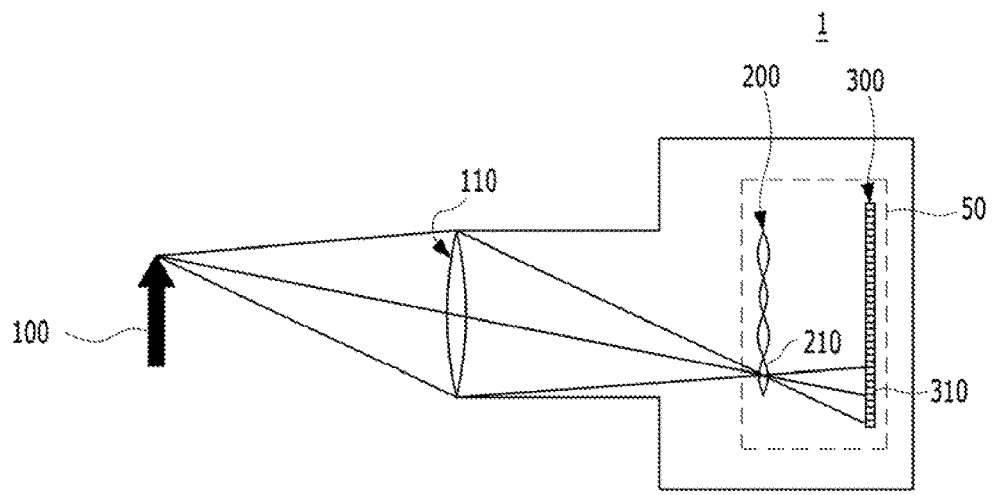
FIG. 1 is a schematic illustration of a light field imaging device.

Various embodiments will be described below in more detail with reference to the accompanying drawings. The present invention may, however, be embodied in different forms and should not be construed as being limited to the embodiments set forth herein. Rather, these embodiments are provided so that this disclosure will be thorough and complete. Throughout the disclosure, like reference numerals refer to like parts throughout the various figures and embodiments of the present invention.

The drawings may not be necessarily to scale and in some instances, proportions of at least some of structures in the drawings may have been exaggerated in order to clearly illustrate certain features of the described examples or embodiments. In presenting a specific example in a drawing or description having two or more layers in a multi-layer structure, the relative positioning relationship of such layers or the sequence of arranging the layers as shown reflects a particular embodiment for the described or illustrated example and a different relative positioning relationship or sequence of arranging the layers may be possible. In addition, as described or illustrated an example of a multi-layer structure may not reflect all layers present in that particular multilayer structure (e.g., one or more additional layers may be present between two illustrated layers). As a specific example, when a first layer in a described or illustrated multi-layer structure is referred to as, being "on" or "over" a second layer or "on" or "over" a substrate, the first layer may be directly formed on the second layer or the substrate but may also represent a structure where one or more other intermediate layers may exist between the first layer and the second layer or the substrate.

Embodiments described below provide a light field imaging device exhibiting improved performance and a method for fabricating the same. More specifically, according to an embodiment of the invention, a light field imaging device is provided including a light field microlens array and an image sensor both being integrated in a chip. The light field imaging device may substantially reduce and or prevent optical loss in the integrated device. The present invention is also directed to a method for fabricating the light field imaging device. Hereafter, for the sake of convenience in explanation, light field microlenses and an array thereof will be respectively referred to as microlenses and a microlens array.

Referring now to FIG. 1, a light field imaging device 1 is provided.

In a conventional imaging device including an image sensor, for example, a 2D (two-dimensional) camera, the image sensor may acquire light intensity information for light introduced through an objective lens to generate an image. For example, light intensity information for one point of an object may be obtained by focusing and cumulating, for a predetermined time, a plurality of incident lights emitted from the one point of the object, on one point of the image sensor, using the objective lens, and one image may be made using light intensity information of lights obtained from a plurality of pixels of the image sensor. However, the image acquisition scheme of such a 2D camera may make impossible to obtain information on the intensities and directions of individual incident lights emitted from one point of the object.

On the contrary, as shown in FIG. 1, the light field imaging device 1 may acquire intensity and direction for each of a plurality of incident lights emitted from one point of an object 100 to generate an image corresponding to a certain point of view or point of focus. The light field technology employed by the light field imaging device 1 permits implementing a 3D (three-dimensional) camera capable of obtaining informations on a plurality of view points of the object 100 and depth information of the object 100 or an imaging device having a refocusing effect capable of focusing arbitrarily on all objects 100 within an angle of view.

A light field imaging device 1 may include an objective lens 110, a microlens array 200 and an image sensor 300 disposed within an enclosure 50. For example, the microlens array 200 may have a plurality of microlenses 210 arranged two-dimensionally in columns and rows. The microlens array 200 may be disposed between the objective lens 110 and the image sensor 300. Each microlens 210 in the microlens array 200 may correspond to a plurality of pixels 310 of the image sensor 300. Accordingly, images of different view points may be obtained from the plurality of pixels 310 corresponding to each microlens 210. For example, in the case where each microlens 210 covers 10×10 pixels 310, 10×10 images having different view points may be obtained simultaneously.

A conventional light field imaging device may have a disadvantage in that, since the image sensor 300 and the microlens array 200 may be structured independently of each other and are mechanically divided from each other by a mechanism the overall volume of the device may increase. Also, since the image sensor 300 and the microlens array 200 are fabricated separately from each other, a higher cost may be incurred. Further, a quality of the image may deteriorate since the microlens array 200 and the image sensor 300, both of which are formed individually, are mechanically coupled with each other causing a mismatch between the microlens array 200 and the image sensor 300.

In order to overcome these disadvantages, an integration method may be used in which the microlens array 200 and the image sensor 300 are integrated in a chip. If the microlens array 200 and the image sensor 300 are integrated in a chip, mismatches due to a distance between the microlens array 200 and the image sensor 300 and the relative positions of the microlenses 210 and the pixels 310 may be decreased or eliminated. Moreover, the overall device structure may be simplified and the fabrication cost may be reduced.

Although not shown, in order to integrate the microlens array 200 and the image sensor 300 into a chip, a spacer layer may be formed on the image sensor 300, and then the microlens array 200 may be formed on the spacer layer. For example, the spacer layer formed between the microlens array 200 and the image sensor 300 may have a thickness of several tens of micrometers. The spacer layer may be made of an effective light transmitting material to reduce optical loss occurring when incident lights pass through the spacer layer. Despite using an effective light transmitting material, the sensitivity of the image sensor may nevertheless suffer due to optical loss occurring when the light is transmitted through the spacer layer.

Therefore, embodiments of the present invention described below provide a light field imaging device, and a method for fabricating the same wherein the microlens array and the image sensor are integrated into a chip without any substantial optical loss occurring due to the integration.

Figure 2:
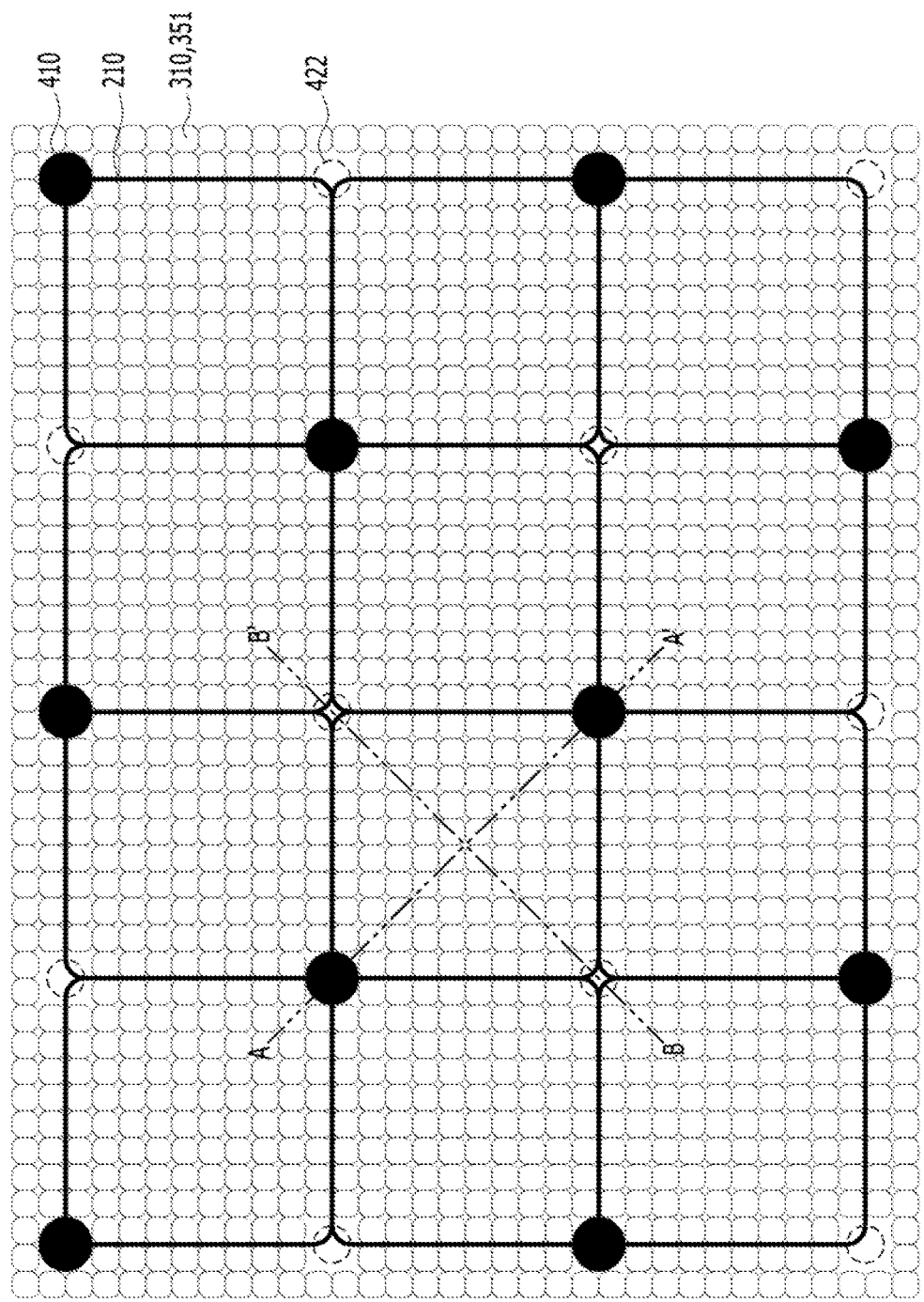
FIG. 2 is a plan view of a light field imaging device, according to an embodiment of the present invention.
Figure 3:
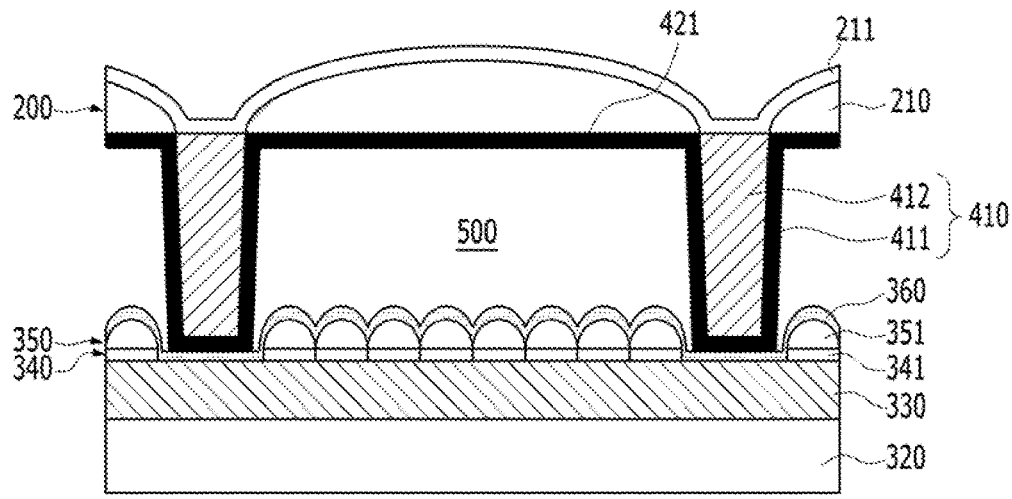
FIGS. 3 and 4 are cross-sectional views taken along the lines A-A' and B-B', respectively, of FIG. 2.
Figure 4:
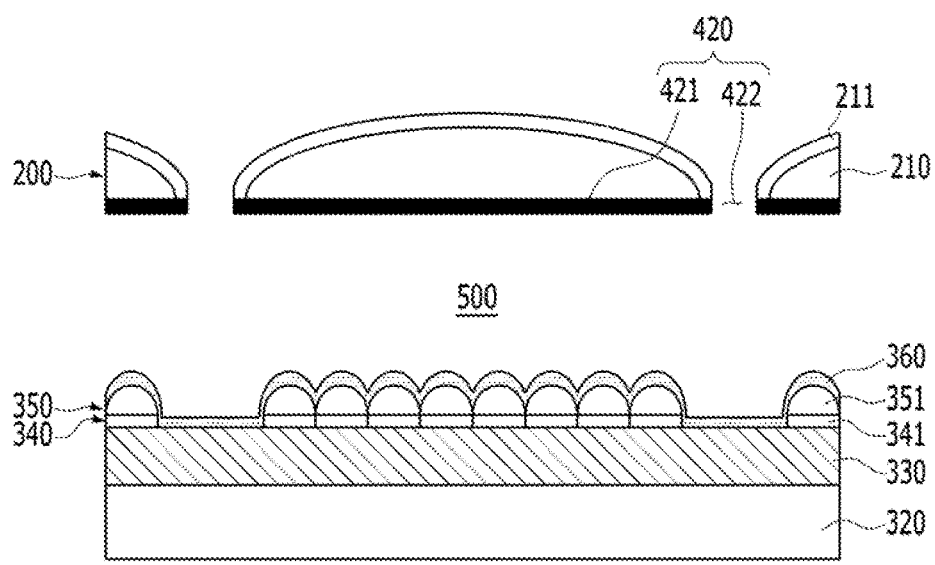

As shown in FIGS. 2 to 4, a light field imaging device according to an embodiment of the present invention may include an image sensor 300 in which a plurality of pixels 310 may be two-dimensionally arranged, a microlens array 200 formed over the image sensor 300 in which a plurality of microlenses 210 may be two-dimensionally arranged, and a support structure 400 formed between the image sensor 300 and the microlens array 200 to provide an air gap 500 therebetween. The support structure 400 may include a plurality of first support structures 410 formed on the image sensor 300 and a second support structure 420 coupled to the plurality of first support structures 410. The plurality of first support structures 410 may support the microlens array 200 and have a pillar shape. The second support structure 420 may contact a bottom surface of the microlens array 200 and have a plate shape.

In the light field imaging device according to an embodiment of the present invention, the image sensor 300 may be a CCD (charge-coupled device) or CMOS (complementary metal oxide semiconductor) image sensor 300. The image sensor 300 may include the plurality of pixels 310 which are two-dimensionally arranged. Each of the plurality of pixels 310 may independently sense an incident light and output an electrical signal corresponding to an intensity of the incident light.

For example, the mage sensor 300 may include a photoelectric conversion layer 330 on a substrate 320 a color filter layer 340 on the photoelectric conversion layer 330, a sub-microlens array 350 on the color filter layer 340, and a first protective layer 360 formed on the entire surface of a structure including the sub-microlens array 350.

The photoelectric conversion layer 330 may include a plurality of photoelectric conversion elements, for example, photodiodes, each of which may correspond to each of the plurality of pixels 310. The photodiodes may include inorganic or organic photodiodes. The photoelectric conversion layer 330 may be formed inside the substrate 320. The photoelectric conversion layer 330 may be formed on the substrate 320. The substrate 320 may be made of a single crystal semiconductor substrate. The substrate 320 may be made of any suitable semiconductor material, such as, for example, a silicon-containing material.

The color filter layer 340 may separate colors of incident lights. The color filter layer 340 may include a plurality of color filters 341 respectively corresponding to the plurality of pixels 310. The plurality of color filters 341 may include a red filter, a green filter, a blue filter, a cyan filter, a yellow filter, a magenta filter, a white filter, a black filter, an IR cutoff filter, and the like.

In the color filter layer 340, color filters 341 in regions corresponding to the respective vertices of each microlens 210 may be removed. For example, 2×2 color filters 341 corresponding to the respective vertices of each microlens 210 may be removed. Accordingly, color filters 341 may not be formed under the first support structures 410.

Figure 5:
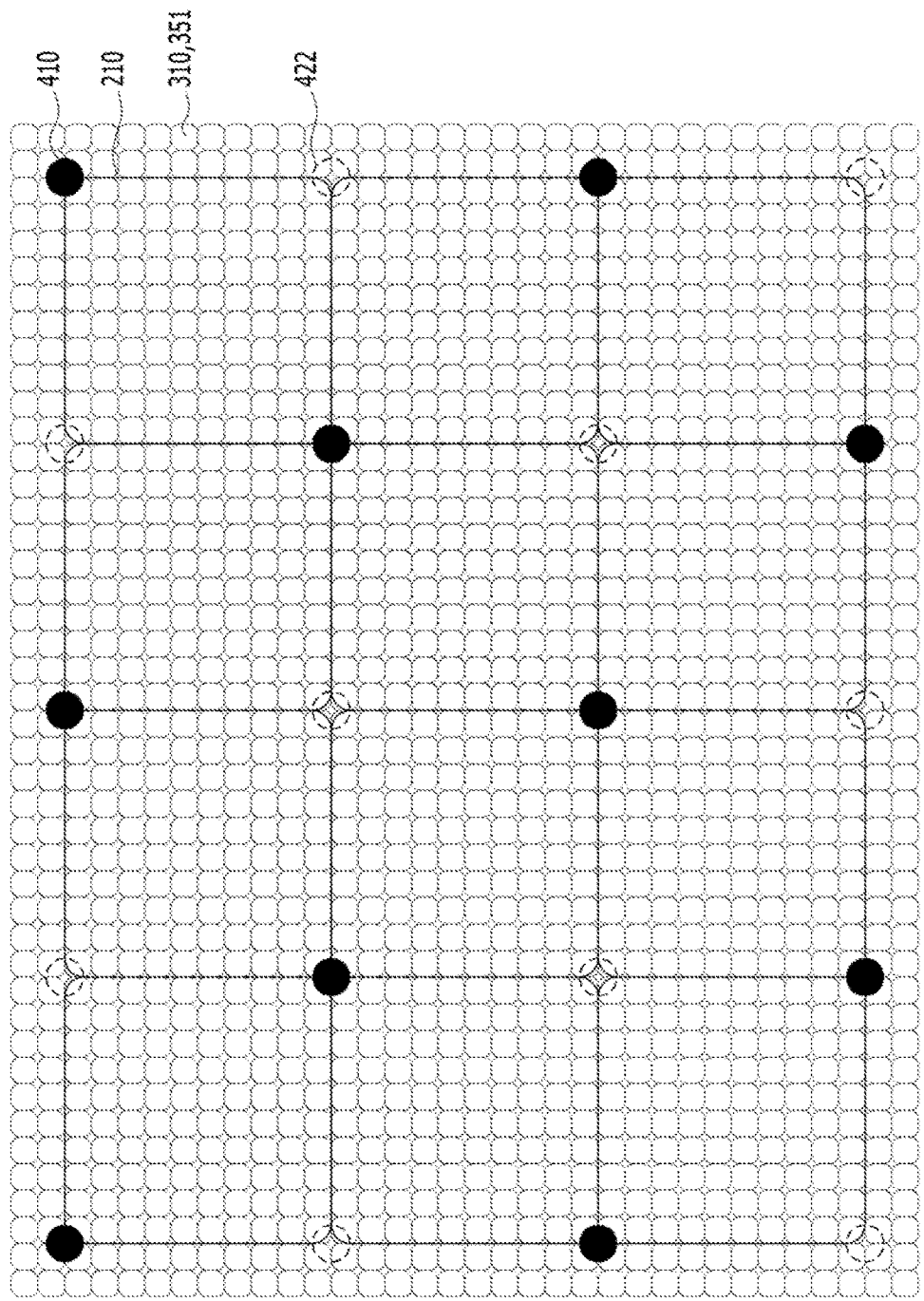
FIGS. 5 and 6 are plan views illustrating modified examples of a light field imaging device according to embodiments of the present invention.
Figure 6:
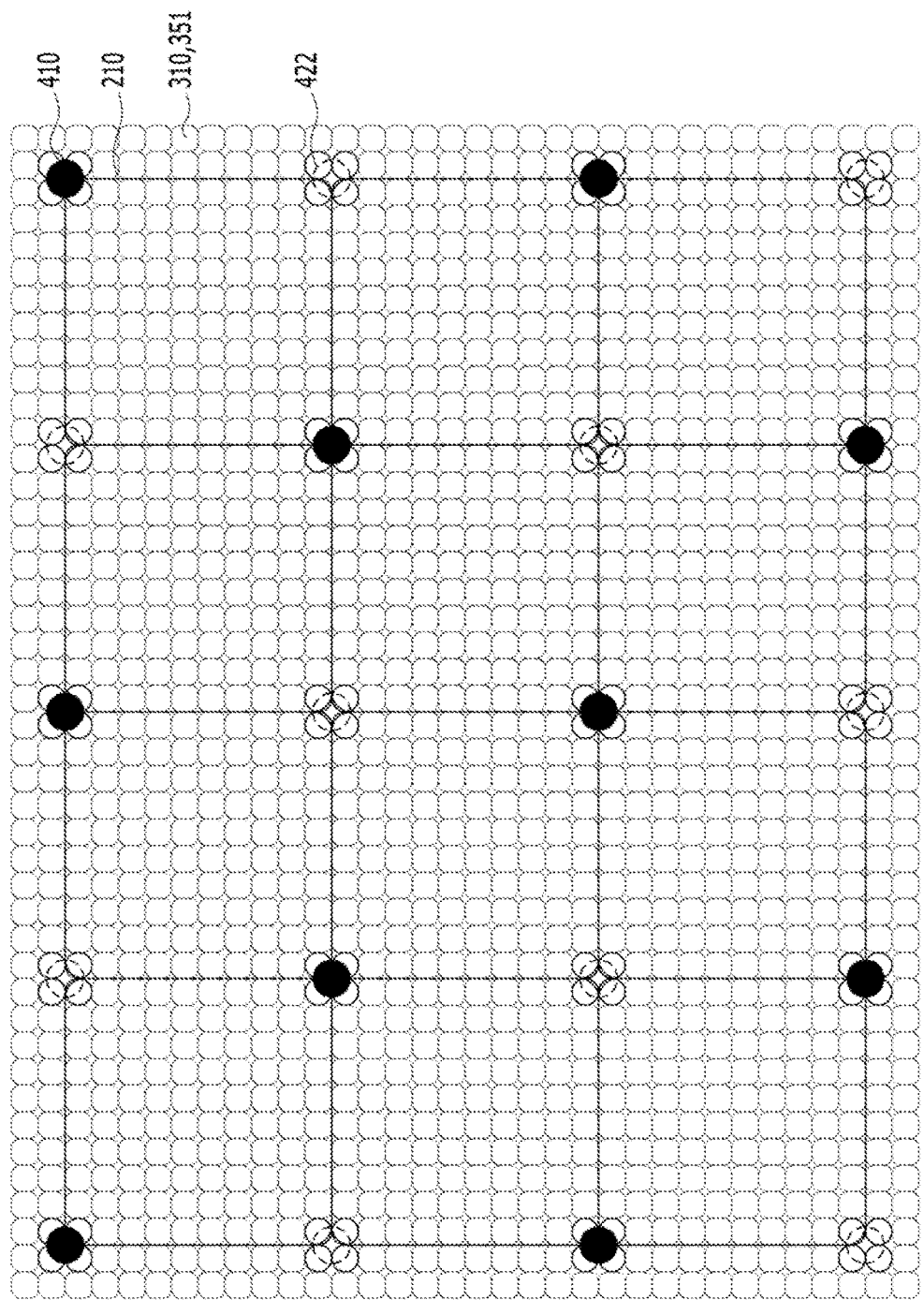

Meanwhile, as shown in FIGS. 5 and 6, when sub-microlenses 351 may exist in the regions corresponding to the respective vertices of each microlens 210, color filters 341 may also exist in such regions.

The sub-microlens array 350 may include a plurality of sub-microlenses 351 which are two-dimensionally arranged. The plurality of sub-microlenses 351 may correspond to the plurality of pixels 310, respectively. In an embodiment, each of the plurality of sub-microlenses 351 may be made of a hemispherical lens. In another embodiment, each of the plurality of sub-microlenses 351 may be made of a digital lens. The digital lens may have a shape that a plurality of material layers having different refractive indexes may be alternately disposed in a vertical or horizontal direction according to a sub-wavelength optics or a sub-wavelength effect. When viewed from the top, each of the plurality of sub-microlenses 351 may have a polygonal shape having at least four sides or a circular shape. The vertices of the polygonal shape may preferably be rounded.

In the sub-microlens array 350, sub-microlenses 351 in the regions corresponding to the respective vertices of each microlens 210 may be removed. For example, 2×2 sub-microlenses 351 corresponding to the respective vertices of each microlens 210 may be removed. Accordingly, sub-microlenses 351 may not be formed under the first support structures 410. In this case, since contact areas between the image sensor 300 and the first support structures 410 may be increased, stability of the first support structures 410 may be improved.

Alternatively, as shown in FIGS. 5 and 6, in the sub-microlens array 350, sub-microlenses 351 in the regions corresponding to the respective vertices of each microlens 210 may exist. In this case, because a mask for removing sub-microlenses 351 in the regions corresponding to the respective vertices of each microlens 210 may be omitted in the fabrication process, fabrication cost may be reduced. Moreover, for obtaining an increased amount of depth information, output signals from pixels 310 in regions where the first support structures 410 are positioned may be used in image processing.

As shown in FIG. 6, in the sub-microlens array 350, the sub-microlenses 351 may have different shapes. For example, shapes of sub-microlenses 351 in the regions (hereinafter, referred to as first regions) corresponding to the respective vertices of the microlenses 210 and shapes of sub-microlenses 351 in the other regions (hereinafter, referred to as second regions) may be different from each other. When viewed from the top, for example, the sub-microlenses 351 in the first regions may be a circular shape, while the sub-microlenses 351 in the second regions may be a quadrangular shape rounded at respective vertices. As the shapes of the sub-microlenses 351 in the first regions and the second regions may be varied in this way, stability of the first support structures 410 may be improved. At the same time output signals from pixels 310 in the regions where the first support structures 410 are positioned may be used in image processing.

The first protective layer 360 formed on the entire surface of the structure including the sub-microlens array 350, may protect the sub-microlens array 350 and the structure lying thereunder, during the fabrication process. The first protective layer 360 may be made of a light transmitting material.

In the light field imaging device, according to the embodiment of the present invention, the microlens array 200 may be positioned over the image sensor 300 by being vertically spaced from the image sensor 300. The microlens array 200 may include the plurality of microlenses 210 two-dimensionally arranged and a second protective layer 211 covering the microlens array 200. The second protective layer 211 may protect the microlens array 200 during the fabrication process. The second protective layer 211 may be made of a light transmitting material.

Each of the plurality of microlenses 210 may overlap with a plurality of pixels 310. For example, in the microlens array 200, each microlens 210 may overlap with a plurality of pixels 310 or a plurality of sub-microlenses 351. For example, referring to FIG. 2, each microlens 210 may overlap with 10×10 pixels 310. Of course, the number of pixels 310 overlapped by each microlens 210 may be adjusted to obtain a desired performance. Pixels actually used in the image processing may be 6×6 to 8×8 pixels 310 among the 10×10 pixels 310. The remaining pixels 310 may not be used in the image processing due to a phenomenon that surroundings may become dark. Of course, as the case may be, all of the 10×10 pixels 310 may be used in the image processing. When the number of pixels 310 used in the image processing increases, the number of images to be used in the refocusing may increase also and, thus, an increased amount of depth information may be obtained on the whole.

Each of the plurality of microlenses 210 may include a hemispherical lens. Each of the plurality of microlenses 210 may include a digital lens. In an embodiment, each of the plurality of microlenses 210 may have a polygonal shape having at least four sides rounded at respective vertices, when viewed from the top. This may provide an air gap 500 between the image sensor 300 and the microlens array 200, using the support structure 400 occupying a minimum space. For example, each of the plurality of microlenses 210 may have a shape having a plurality of vertices, at least two of which may overlap with the first support structures 410. For example, each of the plurality of microlenses 210 may have a shape that two vertices positioned in a diagonal direction may overlap with the first support structures 410. A Plurality of microlenses 210 may share single first support structure 410.

In the light field imaging device, according to an embodiment of the present invention, the support structure 400 may integrate the image sensor 300 and the microlens array 200 into a chip and provide the air gap 500 therebetween, thereby substantially preventing optical loss. Namely, the support structure 400 capable of being formed to occupy a remarkably small area may replace the spacer layer adopted to integrate the image sensor 300 and the microlens array 200 into a chip in a light field imaging device, and the remaining space may be formed as the air gap 500. Accordingly; it is possible to substantially prevent the optical loss. The support structure 400 may be made of a light transmitting material.

The plurality of first support structures 410 may be disposed in a zigzag pattern on the image sensor 300. For example, the plurality of first support structures 410 may be disposed in a zigzag pattern to overlap with the vertices of the plurality of microlenses 210. Each of the plurality of first support structures 410 may include a first support layer 411 having a cylinder shape or a hollow pillar shape, and a sealing layer 412 formed on the first support layer 411 to fill inside spaces formed by the first support layer 411. The cylinder shape may mean a cup shape. The sealing layer 412 may be made of the same material as the first support layer 411. In this case, the first support structure 410 may have a pillar shape formed of a single material. On the contrary, the sealing layer 412 may be made of a material different from the first support layer 411. In particular, the sealing layer 412 may be made of the same material as the microlenses 210.

The second support structure 420 may include a second support layer 421 extended from the first support layer 411 to contact the bottom surfaces of the plurality of microlenses 210, and a plurality of openings 422 formed in the second support layer 421 between the plurality of microlenses 210. The second support layer 421 may be integrated with the first support layer 411. The integration may mean that the first support layer 411 and the second support layer 421 are formed together by a single process. Also the integration may mean that the first support layer 411 and the second support layer 421 are coupled with each other to have a continuous structure. The second support layer 421 may be made of the same material as the first support layer 411. The plurality of openings 422 for forming cavities may be disposed alternately with the first support structures 410. For example, the plurality of openings 422 may be disposed in a zigzag pattern to deviate from the plurality of first support structures 410.

The light field imaging device according to an embodiment of the present invention includes the support structure 400 formed between the image sensor 300 and the microlens array 200 to provide the air gap 500 therebetween. Accordingly, the image sensor 300 and the microlens array 200 may be integrated into a chip and it is possible to substantially prevent the optical loss due to the integration into a chip.

Hereafter, an example of a method for fabricating a light field imaging device according to an embodiment of the present invention will be described with reference to drawings.

Figure 7:
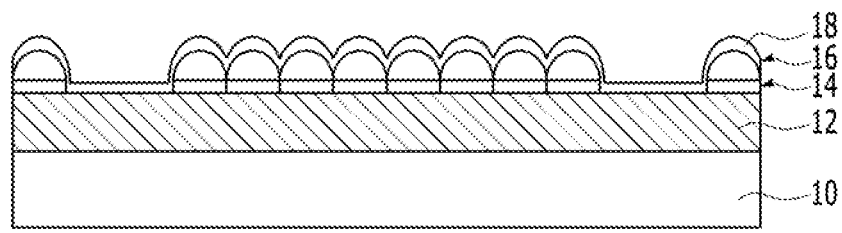
FIGS. 7, 8A, 9A, 10A, 11A 12A and 13A are cross-sectional views corresponding to the line A-A' of FIG. 2, illustrating a method for fabricating a light field imaging device, according to an embodiment of the present invention.

As shown in FIG. 7, an image sensor manufactured according to an embodiment of the present invention is provided. The image sensor may include a photoelectric conversion layer 12 on a substrate 10, a color filter layer 14 on the photoelectric conversion layer 12, and a sub-microlens array 16 on the color filter layer 14.

Next, the sub-microlens array 16 may be selectively etched. Portions of the sub-microlens array 16 in the regions corresponding to the respective vertices of microlenses to be formed through subsequent processes may be removed by an etching process.

A first protective layer 18 may be formed on an entire surface of the structure including the etched sub-microlens array 16. The first protective layer 18 may be made of a light transmitting material. The first protective layer 18 may protect the sub-microlens array 16 and the structure lying thereunder, during subsequent processes.

Figure 8A:
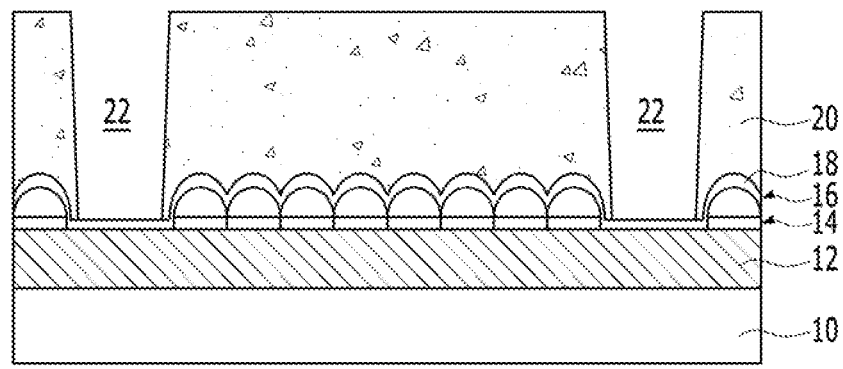
Figure 8B:
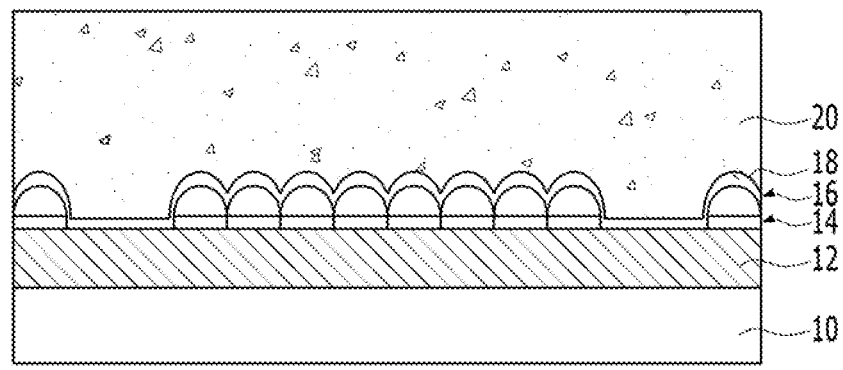

As shown in FIGS. 8A and 8B, a sacrificial layer 20 may be formed on the first protective layer 18. The sacrificial layer 20 may be made of a material having an etching selectivity with respect to the first protective layer 18. A thickness of the sacrificial layer 20 may be controlled to several tens of micrometers according to a focal distance between the image sensor and a microlens array.

After forming a mask pattern (not shown) on the sacrificial layer 20, the sacrificial layer 20 may be etched using the mask pattern as an etch barrier until the first protective layer 18 is exposed, thereby forming a plurality of first openings 22. The plurality of first openings 22 may provide spaces in which first support structures (see, reference numeral 410 of FIGS. 2 and 3) are to be formed. The plurality of first openings 22 may have inclined sidewalls.

Figure 9A:
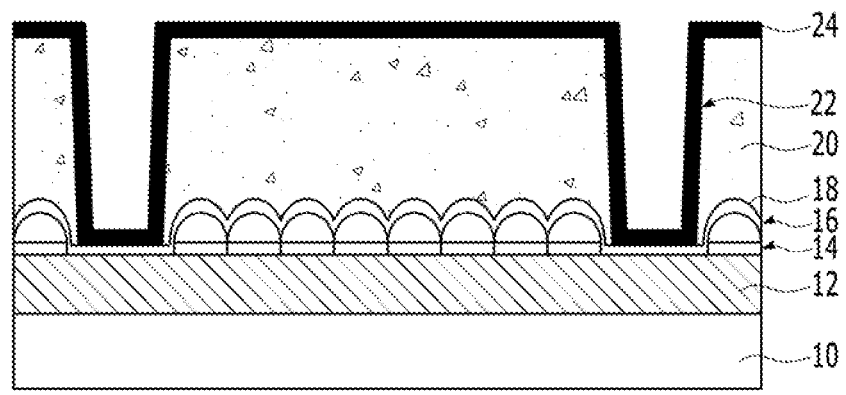
Figure 9B:
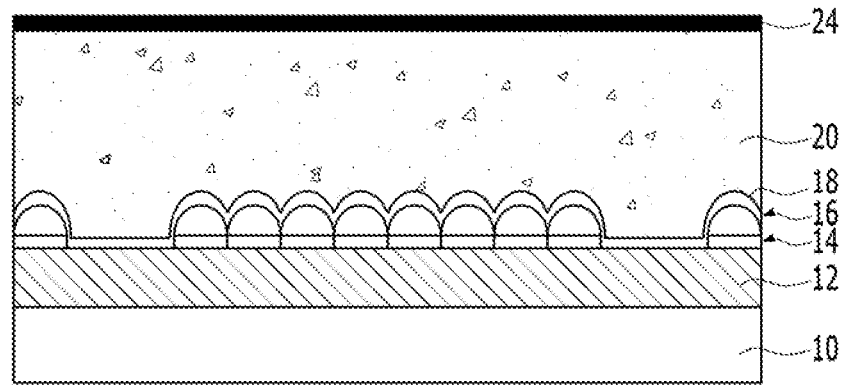

As shown in FIGS. 9A and 9B, a support layer 24 may be formed on a surface of the structure including the plurality of first openings 22. The support layer 24 may be made of a light transmitting material having an etching selectivity with respect to the sacrificial layer 20. The support layer 24 may be formed on the surface of the structure to have a uniform thickness that may not completely fill the first openings 22. Forming the support layer 24 so that it does not fill the first openings 22 may prevent the support layer 24 formed on a top surface of the sacrificial layer 20 from reaching a thickness that is more than necessary and may also prevent an occurrence of a poor filling in the first openings 22.

Referring to FIGS. 2 to 4, in the support layer 24 formed by the above-described processes, the support layer 24 formed in the first openings 22 may serve as the first support layer 411 of the first support structures 410 having the cylinder shape, and the support layer 24 formed on the top surface of the sacrificial layer 20 may serve as the second support layer 421 of the second support structure 420 having the plate shape.

Meanwhile, in the case where a line width of the first openings 22 is small, the support layer 24 may be formed to fill the first openings 22.

Figure 10A:
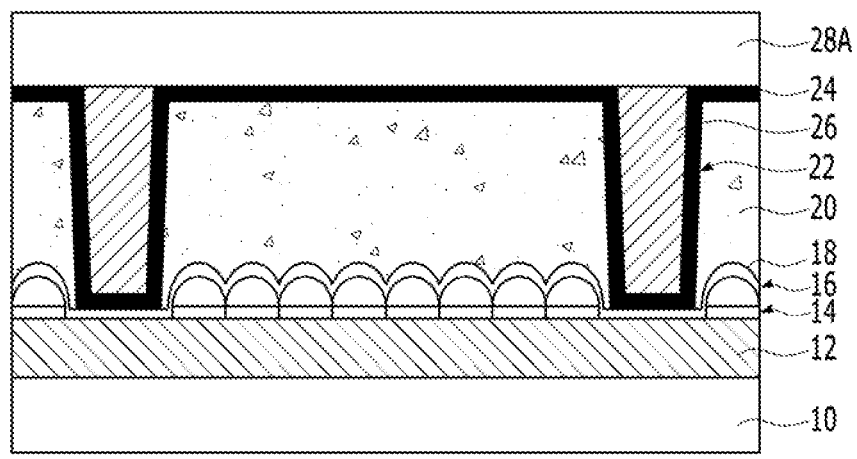
Figure 10B:
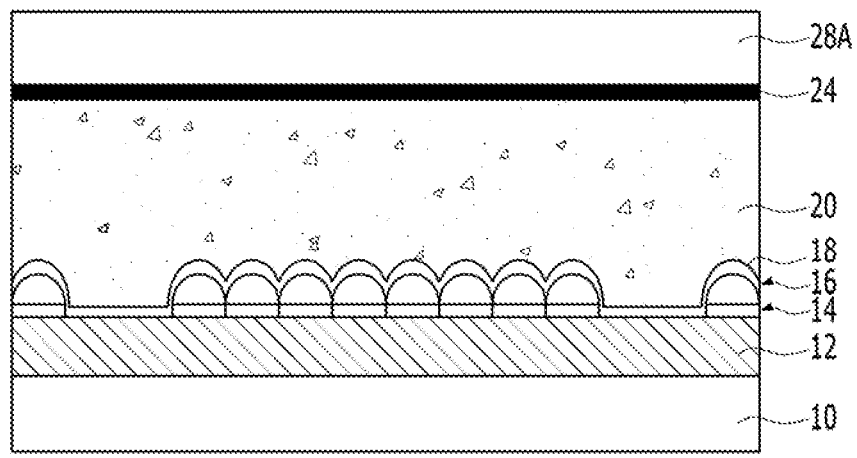

As shown in FIGS. 10A and 10, a sealing layer 26 may be formed on the support layer 24 to fill the first openings 22. The sealing layer 26 may be made of a light transmitting material.

A lens layer 28A may be formed on the support layer 24 including the sealing layer 26. The lens layer 28A may form a plurality of microlenses 28. For example, the lens layer 28A may form a microlens array. The lens layer 28A and the sealing layer 26 may be made of the same material. In an embodiment, the sealing layer 26 and the lens layer 28A may be formed simultaneously.

Referring to FIGS. 2 to 4, through the above-described processes, it is possible to form the first support structures 410 including the support layer 24 and the sealing layer 26 formed in the first openings 22. The first support structures 410 may be formed to be disposed in a zigzag pattern on the image sensor 300.

Figure 11A:
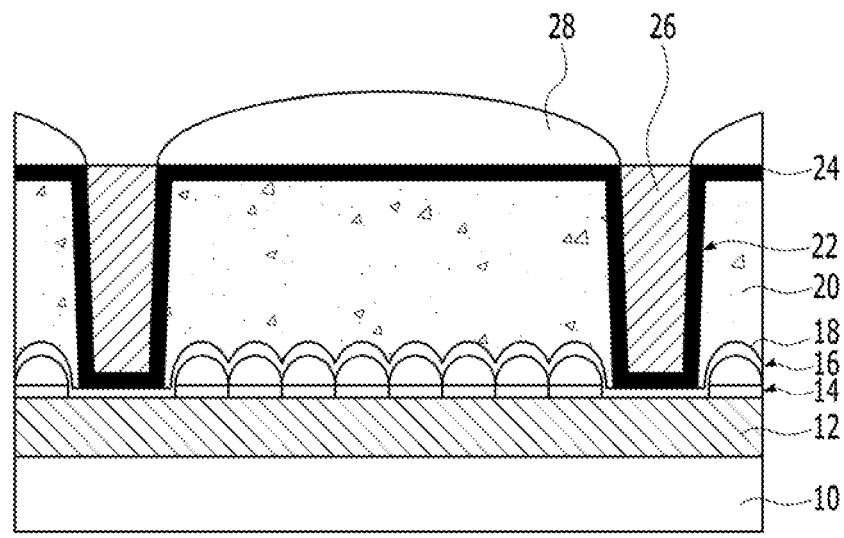
Figure 11B:
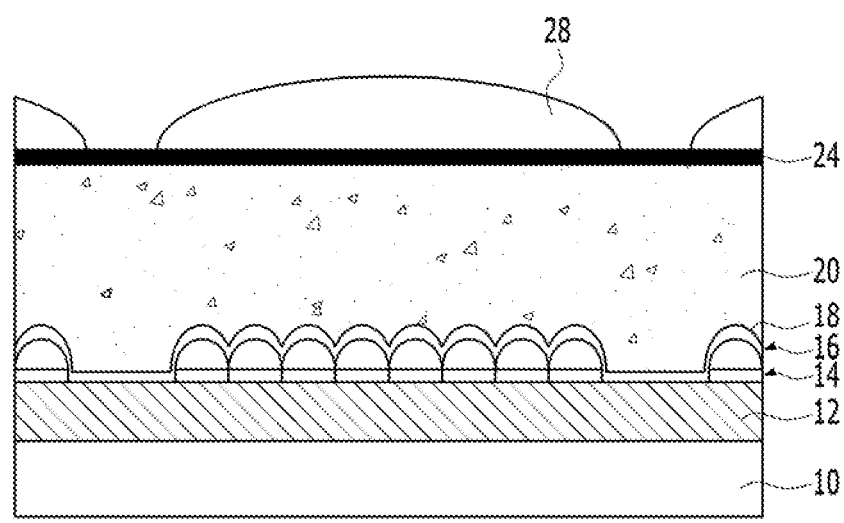

As shown in FIGS. 11A and 11B, a microlens array in which a plurality of microlenses 28 are arranged two-dimensionally is formed using the lens layer 28A. Each of the plurality of microlenses 28 may be made of a hemispherical lens, and may be formed to have a quadrangular shape rounded at respective vertices, when viewed from the top. For example, the plurality of microlenses 28 may be formed by performing a reflow process after patterning the lens layer 28A.

By referring to FIGS. 2 to 4, each of the plurality of microlenses 28 may be formed to have a shape having a plurality of vertices, at least two of which may overlap with the first support structures 410. For example, each of the plurality of microlenses 28 may be formed to have a shape wherein two vertices positioned in a diagonal direction overlap with the first support structures 410. Further, a plurality of microlenses 28 may be formed to share single first support structure 410.

Figure 12A:
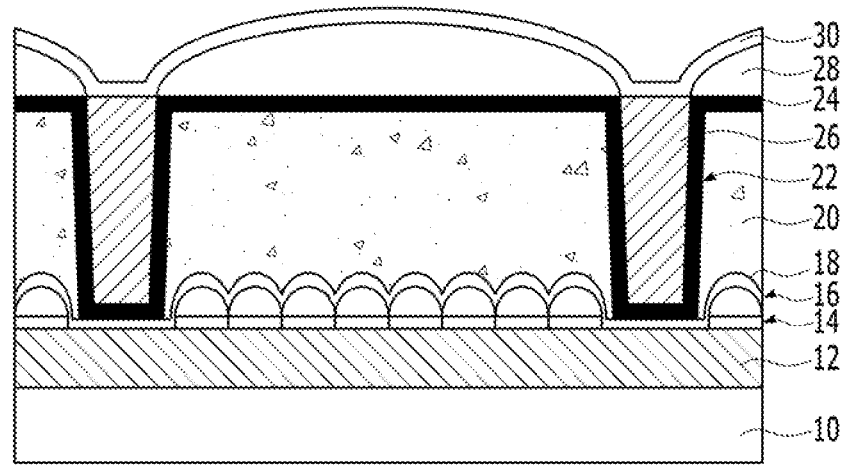
Figure 12B:
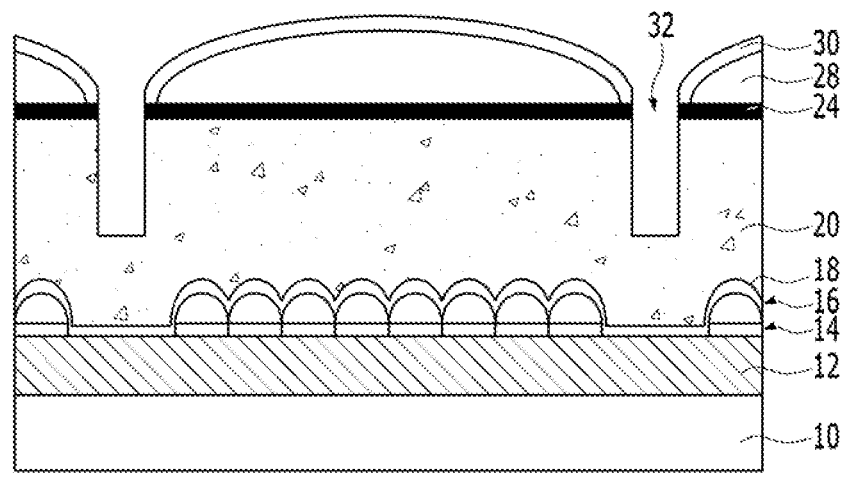

As shown in FIGS. 12A and 12B, a second protective layer 30 may be formed on the entire surface of the structure including the microlens array. The second protective layer 30 may protect the microlens array during subsequent processes. The second protective layer 30 may be made of a material having an etching selectivity with respect to the sacrificial layer 20.

A plurality of second openings 32 may be formed by etching the second protective layer 30, the support layer 24 and the sacrificial layer 20 between the plurality of microlenses 28. The plurality of second openings 32 may provide entrances through which an etchant for removing the sacrificial layer 20 may be introduced. The plurality of second openings 32 may be formed in a zigzag pattern to be disposed alternately with the plurality of first openings 22.

Referring to FIGS. 2 to 4, through the above-described processes, it is possible to form the second support structure 420 including the second support layer 421 extended from the first support layer 411 to contact the bottom surfaces of the plurality of microlenses 210, and the plurality of openings 422 formed in the second support layer 421 between the plurality of microlenses 210.

Figure 13A:
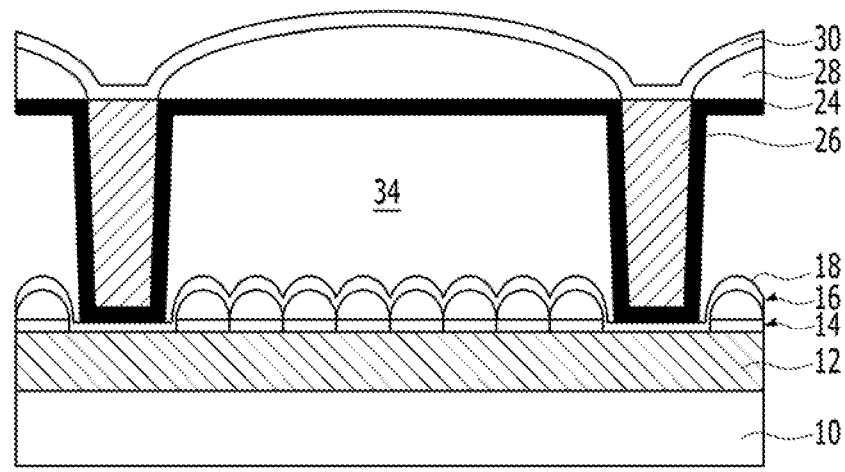
Figure 13B:
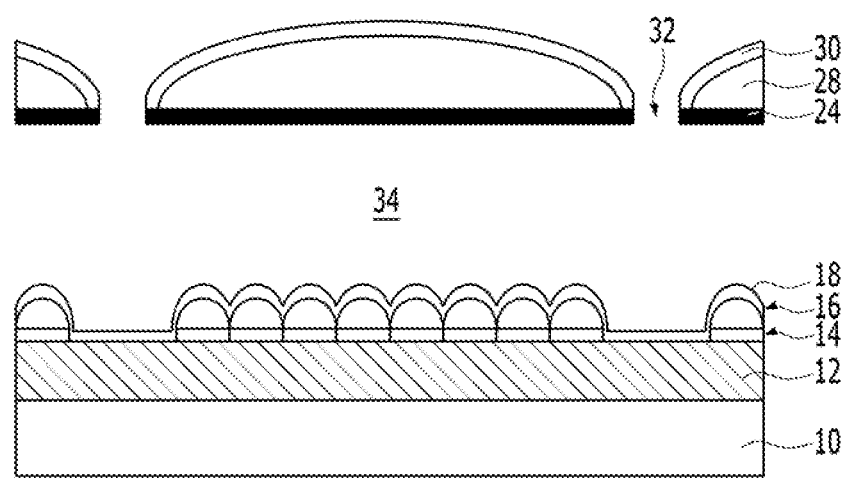

As shown in FIGS. 13A and 13B, by removing the sacrificial layer 20 through the second openings 32, an air gap 34 may be formed between the image sensor and the microlens array. The sacrificial layer 20 may be removed using a wet etching process.

The light field imaging device formed according to the above-described fabrication method includes a support structure formed between the image sensor and the microlens array to provide the air gap 34 therebetween. As a consequence, the image sensor and the microlens array may be integrated into a chip, without the optical loss problem of the prior art integration technique.

Although various embodiments have been described for illustrative purposes, it will be apparent to those skilled in the art that various changes and modifications may be made without departing from the spirit and or scope of the invention as defined in the following claims.

What is claimed is:

1. A light field imaging device comprising:
an image sensor including a sub-microlens array in which a plurality of sub-microlenses are arranged two-dimensionally;
a microlens array formed over the image sensor, and having a plurality of microlenses arranged two-dimensionally therein; and
a support structure formed between the image sensor and the microlens array for providing an air gap therebetween,
the support structure comprising:
a plurality of first support structures formed over the image sensor to support the microlens array, and having a pillar shape; and
a second support structure coupled to the first support structures to contact a bottom surface of the microlens array, and having a plate shape, wherein each of the plurality of first support structures comprises a sealing layer formed over a first support layer to fill inside spaces formed by the first support layer.

2. The light field imaging device according to claim 1, wherein each of the plurality of microlens corresponds to a plurality of sub-microlenses.

3. The light field imaging device according to claim 1, wherein the sub-microlenses are not formed in regions corresponding to respective vertices of the plurality of microlenses.

4. The light field imaging device according to claim 1, wherein the sub-microlenses formed in regions corresponding to respective vertices of the plurality of microlenses have a shape different from the sub-microlenses formed in the other regions.

5. The light field imaging device according to claim 1, wherein each of the plurality of sub-microlenses comprises a hemispherical lens or a digital lens.

6. The light field imaging device according to claim 1, wherein, when viewed from the top, each of the plurality of sub-microlenses is a polygonal shape which has at least four sides and is rounded at respective vertices, or a circular shape.

7. The light field imaging device according to claim 1, wherein each of the plurality of microlenses has a plurality of vertices, and at least two vertices of the plurality of vertices overlap with the first support structures.

8. The light field imaging device according to claim 1, wherein each of the plurality of microlenses has a plurality of vertices, and two of the vertices positioned in a diagonal direction overlap with the first support structures.

9. The light field imaging device according to claim 1, wherein, when viewed from the top, each of the plurality of microlenses is a polygonal shape which has at least four sides and is rounded at respective vertices.

10. The light field imaging device according to claim 1, wherein each of the plurality of microlenses comprises a hemispherical lens or a digital lens.

11. The light field imaging device according to claim 1, wherein the plurality of first support structures are disposed in a zigzag pattern to overlap with vertices of the plurality of microlenses.

12. The light field imaging device according to claim 1, wherein a plurality of microlenses share each of the plurality of first support structures.

13. The light field imaging device according to claim 1, wherein the first support layer of each of the plurality of first support structures has a cylinder shape or a hollow pillar shape.

14. The light field imaging device according to claim 1, wherein the sealing layer includes the same material as the plurality of microlenses or the first support layer.

15. The light field imaging device according to claim 13, wherein the second support structure comprises:
a second support layer extended from the first support layer, and contacting bottom surfaces of the plurality of microlenses; and
a plurality of openings formed in the second support layer between the plurality of microlenses.

16. The light field imaging device according to claim 15, wherein the second support layer is integrated with the first support layer.

17. The light field imaging device according to claim 15, wherein the plurality of openings are disposed in a zigzag pattern to deviate from the plurality of first support structures.

18. The light field imaging device according to claim 15, wherein the plurality of first support structures and the plurality of openings are disposed alternately with each other.

* * * * *